US009690340B2

(12) United States Patent
Edwards et al.

(10) Patent No.: US 9,690,340 B2
(45) Date of Patent: Jun. 27, 2017

(54) SYSTEM AND METHOD FOR ADAPTIVE THERMAL AND PERFORMANCE MANAGEMENT IN ELECTRONIC DEVICES

(71) Applicant: INTEL CORPORATION, Santa Clara, CA (US)

(72) Inventors: James W. Edwards, Hillsboro, OR (US); Meenakshi Gupta, Portland, OR (US); Brian R. Peil, Portland, OR (US); Nicholas R. Weber, Beaverton, OR (US); Nicolas A. Kurczewski, Dupont, WA (US)

(73) Assignee: Intel Corporation, Santa Clara, CA (US)

( * ) Notice: Subject to any disclaimer, the term of this patent is extended or adjusted under 35 U.S.C. 154(b) by 120 days.

(21) Appl. No.: 14/669,275

(22) Filed: Mar. 26, 2015

(65) Prior Publication Data

US 2016/0091938 A1 Mar. 31, 2016

Related U.S. Application Data

(63) Continuation-in-part of application No. 14/496,000, filed on Sep. 25, 2014.

(51) Int. Cl.
*G06F 1/26* (2006.01)
*G06F 1/32* (2006.01)
(Continued)

(52) U.S. Cl.
CPC .............. *G06F 1/206* (2013.01); *G06F 1/203* (2013.01); *G06F 1/3215* (2013.01);
(Continued)

(58) Field of Classification Search
CPC ... H01L 2225/06589; H01L 2225/1094; G06F 1/20; G06F 1/206; G06F 1/1632; H05K 7/20172; H05K 7/20209; Y02B 60/1275
See application file for complete search history.

(56) References Cited

U.S. PATENT DOCUMENTS 5,230,055 A 7/1993 Katz et al.
5,974,556 A 10/1999 Jackson et al.
(Continued)

OTHER PUBLICATIONS

International Search Report and Written Opinion received for PCT Patent Application No. PCT/US2016/018896, mailed on May 27, 2016, 13 pages.
(Continued)

*Primary Examiner* — Xuxing Chen
(74) *Attorney, Agent, or Firm* — Inventive Patent Law, P.C.; Jim H. Salter

(57) ABSTRACT

A system and method for adaptive thermal and performance management in electronic devices are disclosed. A particular embodiment includes: providing a processor with a plurality of selectable performance levels and a sensor in an electronic device; receiving sensor information from the sensor, the sensor information including information for determining if the electronic device is positioned proximately to an active airflow; determining a device context from the sensor information; and dynamically modifying the performance level of the processor by implementing one of a plurality of selectable performance levels of the processor based on the device context.

18 Claims, 9 Drawing Sheets

Processing Logic for Adaptive Thermal and Performance Management in Electronic Devices
-1100-

Provide a processor with a plurality of selectable performance levels and a sensor in an electronic device.
-1110-

Receive sensor information from the sensor, the sensor information including information for determining if the electronic device is positioned proximately to an active airflow.
-1120-

Determine a device context from the sensor information.
-1130-

Dynamically modify the performance level of the processor by implementing one of a plurality of selectable performance levels of the processor based on the device context.
-1140-

End

(51) Int. Cl.
*G06F 1/20* (2006.01)
*H05K 7/20* (2006.01)
*G06F 1/16* (2006.01)

(52) U.S. Cl.
CPC .......... *G06F 1/3231* (2013.01); *G06F 1/3262* (2013.01); *G06F 1/1632* (2013.01); *H01L 2225/06589* (2013.01); *H01L 2225/1094* (2013.01); *H05K 7/20172* (2013.01); *H05K 7/20209* (2013.01); *Y02B 60/1275* (2013.01); *Y02B 60/1289* (2013.01)

(56) References Cited

U.S. PATENT DOCUMENTS

| | | | | |
|---|---|---|---|---|
| 6,453,378 | B1 * | 9/2002 | Olson | G06F 1/1632 713/322 |
| 8,004,493 | B2 | 8/2011 | Herz et al. | |
| 8,230,246 | B1 | 7/2012 | Sharkey | |
| 2002/0054478 | A1 | 5/2002 | Hidesawa | |
| 2006/0103733 | A1 | 5/2006 | Grady et al. | |
| 2006/0139326 | A1 | 6/2006 | Tsukamoto | |
| 2006/0155424 | A1 | 7/2006 | Katoh et al. | |
| 2008/0059004 | A1 | 3/2008 | Katoh et al. | |
| 2009/0113228 | A1 * | 4/2009 | Mok | G06F 1/1632 713/323 |
| 2009/0287948 | A1 | 11/2009 | Chary | |
| 2012/0066535 | A1 | 3/2012 | Naffziger | |
| 2014/0098486 | A1 | 4/2014 | Davis | |
| 2014/0160657 | A1 | 6/2014 | Morrison et al. | |
| 2014/0189404 | A1 | 7/2014 | Sur et al. | |
| 2014/0249690 | A1 * | 9/2014 | Park | G06F 1/206 700/300 |
| 2015/0095667 | A1 | 4/2015 | Nielsen et al. | |

OTHER PUBLICATIONS

McConnel, Toni, "Smart proximity sensor distinguishes between human body and inert objects", EE Times, Jul. 25, 2012, 2 pages.
Myllymaki, et al., "Capacitive Recognition of the User's Hand Grip Position in Mobile Handsets", Progress in Electromagnetics Research B, vol. 22, 2010, 18 pages.
Noopuran, et al., "Proximity Sensing in Mobile Phones", Cypress Semiconductor, www.cypress.com, Jan. 31, 2014, 10 pages.

* cited by examiner

SYSTEM AND METHOD FOR ADAPTIVE THERMAL AND PERFORMANCE MANAGEMENT IN ELECTRONIC DEVICES

PRIORITY PATENT APPLICATION

This is a continuation-in-part patent application drawing priority from co-pending U.S. patent application Ser. No. 14/496,000; filed Sep. 25, 2014. The entire disclosure of the referenced patent application is considered part of the disclosure of the present application and is hereby incorporated by reference herein in its entirety.

TECHNICAL FIELD

This patent application relates to electronic systems, mobile devices, and computer-implemented software, according to various example embodiments, and more specifically to a system and method for adaptive thermal and performance management in electronic devices.

BACKGROUND

Advances in semiconductor processing and logic design have permitted an increase in the amount of logic that may be present on integrated circuit devices. As a result, computer system configurations have evolved from a single or multiple integrated circuits in a system to multiple hardware threads, multiple cores, multiple devices, and/or complete systems on individual integrated circuits. Additionally, as the density of integrated circuits has grown, the power requirements for computing systems (from embedded systems to servers) have also escalated. Furthermore, software inefficiencies, and its requirements of hardware, have also caused an increase in computing device energy consumption. As a result, there is a vital need for energy efficiency and conservation associated with integrated circuits. These needs will increase as servers, desktop computers, notebooks, Ultrabooks™, tablets, mobile phones, processors, embedded systems, etc. become even more prevalent (from inclusion in the typical computer, mobile devices, wearables, automobiles, and televisions to biotechnology).

Currently, electronic devices including mobile computing systems or mobile devices are designed to operate in the lowest thermal envelope of any of the device's subsystems. As a result, the electronic device must operate at a minimal performance level to maintain a safe thermal operating condition. Existing systems cannot dynamically scale up performance based on adaptive thermal management of the electronic device.

BRIEF DESCRIPTION OF THE DRAWINGS

The various embodiments are illustrated by way of example, and not by way of limitation, in the figures of the accompanying drawings in which.

DETAILED DESCRIPTION

Figure 1:
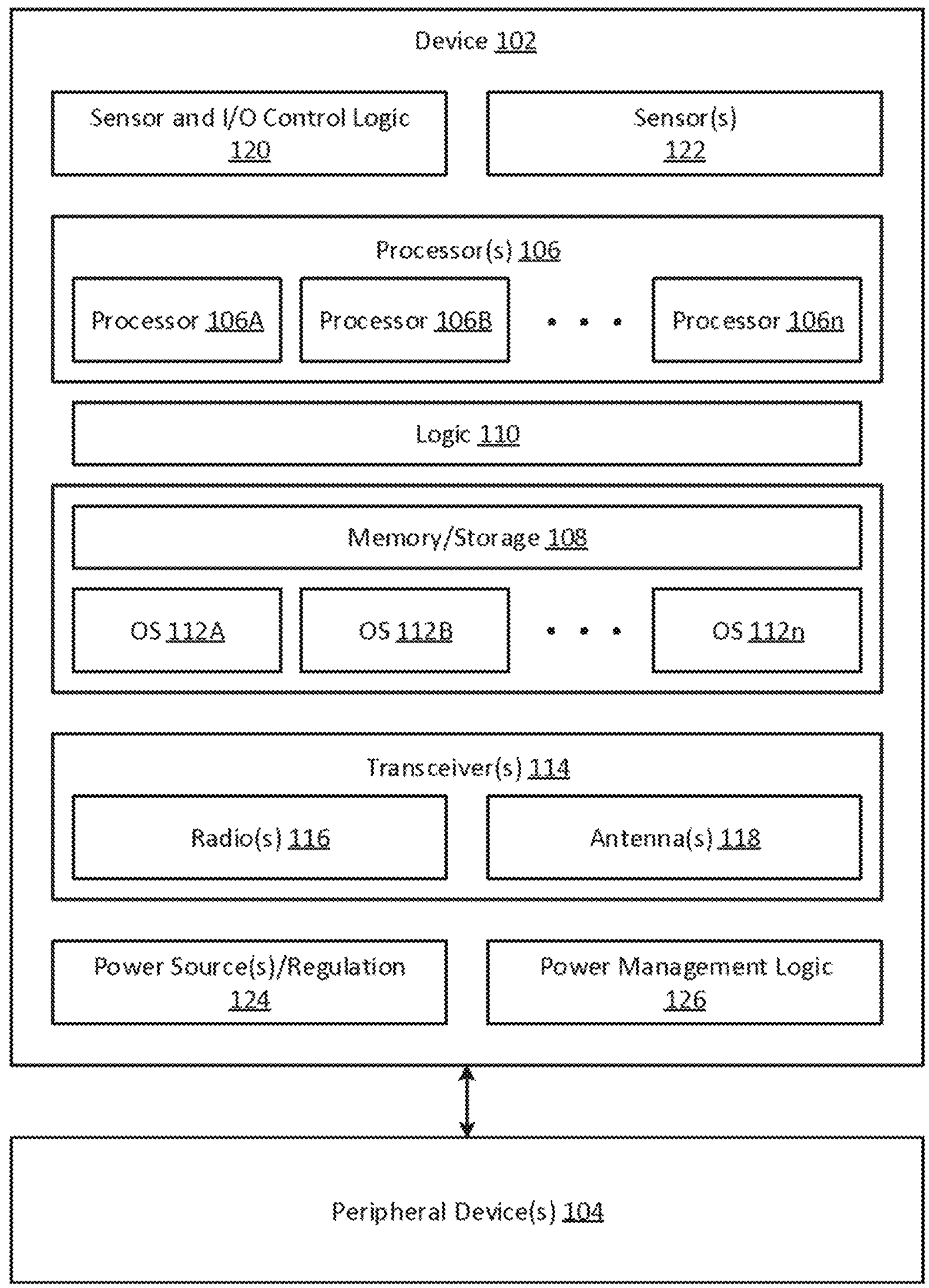
FIG. 1 is a block diagram of an apparatus, according to an example embodiment.

In the following description, for purposes of explanation, numerous specific details are set forth in order to provide a thorough understanding of the various embodiments. It will be evident, however, to one of ordinary skill in the art that the various embodiments may be practiced without these specific details.

In the various embodiments described herein, a system and method for adaptive thermal and performance management in electronic devices are disclosed. The disclosed embodiments can be used with a wide variety of electronic devices, such as mobile computing platforms, mobile devices, mobile systems, portable devices, wearables, all-in-one desktop devices, portable-all-in-one devices (pAIO), laptop computers, handheld computers, touch screen systems, and other electronic devices typically configured to fit in a docking device or with a docking interface. In the various example embodiments, an electronic device may include a mobile system, which may refer to one or more of a laptop computer, a tablet computer, a 2-in-1 device that generally combines functionality of a laptop with usability/portability of a tablet, a smartphone, a wearable device (such as a bracelet, ring, headset, etc.), or other mobile device. In some embodiments the mobile system may include more than one of the aforementioned devices, e.g., multiple devices that are coupled and that may create an improved user experience. Many of these electronic devices can be used in different modes of operation—e.g., vertical, angular, and lay flat modes. The various embodiments described herein are useful for any types of electronic devices or systems that can be used with a docking system. The details of various example embodiments are provided below.

Power Management (PM) in systems, such as mobile systems, is a continuous and evolving process. Efficient management of platform resources while maximizing battery life is a goal of an efficient PM policy. A device context of an electronic device (e.g., a portable device such as a mobile device) may be a representation of external factors that influence efficiency of the device. The external factors may be related to the device's thermal capability, e.g., ability of the device to dissipate heat. Device context may describe orientation of the device, presence or absence of physical contact of the device with a user, presence or absence of proximate air flow that causes heat removal from the device (e.g., by convection), and other factors. For example, context may be affected if a device is in contact with a human (e.g., a user grasping a tablet at the edges or a device placed on a user's lap, etc.). In this case, the thermal management of the device can be configured based on the context to accommodate the human contact. For example, the temperature of the skin of the device ($T_{Skin}$) can be maintained at an increased limit when there is no human contact and maintained at a lower limit if there is human contact. In this manner, the thermal management of the device can improve user comfort when using the device. Device context may be inferred from measurements, and may be evaluated to determine operating parameters of the device in order to achieve greater device efficiency, performance, and/or extend battery life.

In various embodiments, a power management (PM) policy may be utilized to enhance an ability of a data processor in an electronic device to scale performance based on thermal constraints associated with a device context or usage. Device context may be determined through observation of platform states of components, sensors, and usage parameters. Various example embodiments are directed to contextual power management in electronic devices such as mobile devices or systems. The details of various example embodiments are provided below in connection with the accompanying figures.

FIG. 1 is a block diagram of an apparatus, according to an example embodiment. While referred to hereinafter as a device 102 for purposes of simplicity and illustration, it should be understood that the device 102 may include any suitable name, label, configuration and/or form factor and still fall within the described embodiments. The device 102 may include a system having a compact form factor arranged to support a plurality of computing components. As described herein, the device 102 may include any mobile computing device that can be carried or worn by a person (e.g., a user). In different embodiments, the electronic device 102 may be a laptop, a tablet, a 2-in-1 device, a smartphone, a phone/tablet, a wearable device (such as a bracelet, necklace, earring, ring, earpiece, glasses, head-mounted device, etc.), or one or more other mobile-style devices. While described herein as being within this list, one of ordinary skill in the art will understand that embodiments are not limited in this respect.

The device 102 may include one or more data processor circuits 106 (also referred to as processor logic(s), processor core(s), etc.) (e.g. processor 106A, processor 106B, and processors through processor 106*n*, where n is a total count of processors), memory/storage 108, logic 110, operating systems (OS's) 112 (e.g. OS 112A and OS 112B, and OS's through OS 112*m*, where m is a total count of OS's), transceiver(s) that can include 114, radio(s) 116 and antenna(s) 118, sensor and input/output (I/O) control logic (SICL) 120, sensor(s) 122, power source/regulation 124, and power management logic 126. Although the electronic device 102 shown in FIG. 1 has a limited number of elements in a certain topology, it may be appreciated that the device 102 may include more or less elements in alternate topologies as desired for a given implementation.

In various embodiments, device 102 may include the processor circuit 106. The processor circuit 106 can be any of various commercially available processors, including without limitation an AMD® Athlon®, Duron® and Opteron® processors; IBM® and Motorola® DragonBall® and PowerPC® processors; IBM and Sony® Cell processors; Intel® Celeron®, Core (2) Duo®, Core (2) Quad®, Core i3®, Core i5®, Core i7®, Itanium®, Pentium®, Xeon®, and XScale® processors; and similar processors. Dual microprocessors, multi-core processors, and other multi-processor architectures may also be employed as the processor circuit 106.

As shown in FIG. 1, in some embodiments, device 102 may include two processor circuits 106A and 106B, or may include any number of processor circuits. In other embodiments, the processor circuits 106A, 106B, . . . 106*n* may include separate cores of a multi-core processor 106. The example embodiments described herein are not limited in this respect.

In some embodiments, the one or more processor circuits 106A, 106B may include a first processor circuit 106A arranged to execute a first operating system 112A and a second processor circuit 106B arranged to execute a second operating system 112B (and potentially any number (n) of additional operating systems that are to be executed on additional processor circuits). In various embodiments, the logic 110 may be operative to automatically select one of the first processor circuit 106A and first operating system 112A or second processor circuit 106B and second operating system 112B based on the one or more characteristics of peripheral device 104 (e.g., context), as described in more detail below.

The first processor circuit 106A may operate at a first frequency and the second processor circuit 106B may operate at a second frequency that is less than the first frequency in some embodiments. For example, the first processor circuit 106A may include a core capable of executing an operating system 112A, such as an Android® operating system, iOS operating system, OS X operating system, Linux operating system, Windows® operating system or any other suitable operating system. Processor circuit 106B may include a low power, low frequency processor circuit such as a microcontroller (MCU) or the like. Processor circuit 106B may be operative to execute a boot OS, real-time OS (RTOS), run-time OS or limited functionality OS 112B that is designed for a specific purpose, application, or device. The example embodiments described herein are not limited in this respect.

In various embodiments, device 102 may include a memory unit 108. The memory unit 108 may store, among other types of information, logic 110 and OS 112A, OS 112B, etc. The memory unit 108 may include various types of computer-readable storage media in the form of one or more higher speed memory units, such as read-only memory (ROM), random-access memory (RAM), dynamic RAM (DRAM), Double-Data-Rate DRAM (DDRAM), synchronous DRAM (SDRAM), static RAM (SRAM), programmable ROM (PROM), erasable programmable ROM (EPROM), electrically erasable programmable ROM (EEPROM), flash memory, polymer memory such as ferroelectric polymer memory, ovonic memory, phase change or ferroelectric memory, silicon-oxide-nitride-oxide-silicon (SONOS) memory, magnetic or optical cards, an array of devices such as Redundant Array of Independent Disks (RAID) drives, solid state memory devices (e.g., USB memory, solid state drives (SSD) and any other type of storage media suitable for storing information. While shown as being included with memory 108 in FIG. 1, it should be understood that logic 110 and/or OS 112A, 112B may be located elsewhere within device 102 and still fall within the described embodiments.

In some embodiments, device 102 may include logic 110. Examples of logic 110 may include but are not limited to executable computer program instructions implemented using any suitable type of code, such as source code, compiled code, interpreted code, executable code, static code, dynamic code, object-oriented code, visual code, and the like. Embodiments may also be at least partly implemented as instructions contained in or on a non-transitory computer-readable medium, which may be read and executed by one or more processors to enable performance of the operations described herein. In some embodiments, at least a portion of logic 110 can be implemented in hardware. Other embodiments are described and claimed.

Device 102 may include a power source and/or power regulation (PSPR) 124 in various embodiments. In some embodiments, PSPR 124 may include a battery such as a lithium ion battery or the like. In some embodiments, PSPR 124 also may include one or more voltage regulators to regulate the voltage supplied by the power source. PSPR 124 may be operative to provide power to one or more of the components of device 102. The example embodiments described herein are not limited in this respect.

In various embodiments, device 102 may include sensor and I/O control logic (SICL) 120. SICL 120 may include a plurality of input/output (I/O) pins or ports in some embodiments, and may also include logic to interface with one or more sensors 122. Sensors 122 may include accelerometers, gyroscopes, inclinometers, global position system (GPS) receivers, infrared, RADAR, LIDAR, biometric, thermal, environmental, proximity, barometric, humidity, pressure sensors, and may include one or more specific absorption rate (SAR) sensors. For example, the SICL 120 may be operative to interface with one or more peripheral I/O devices as well as with one or more sensors and to report sensor and I/O information to the processor 106. In various embodiments, the SICL 120 may be operative to enable (or arranged to support) plug and play operation between the device 102 and a plurality of other devices.

In operation, one or more of the sensors, e.g., a SAR sensor within the SICL 120, may be operable to detect that a human being (e.g., a user of the device 102) is in physical contact with the device 102. Physical contact of the device 102 with the human being may imply that adjustments should be made in the thermal management of the device 102 to improve user comfort. For example, responsive to an indication of physical contact of the human being with the device 102, operating parameters, e.g., operating speed of one or more of the processors 106, may be adjusted (e.g., reduced) to improve user comfort and to maintain a viable operating temperature of the device 102.

Additionally, SICL 120 may include logic (e.g., software logic, hardware logic, or a combination of both) to dynamically configure the device 102 to interface with one of a number of peripheral devices 104. A pin-out of device 102 is not hardwired in many embodiments and instead can be programmed. This dynamic programmability may be based on a discovery protocol that determines the pin-out of the peripheral device 104 interface upon being coupled to the peripheral device 104. For example, one or more pins may be set to corresponding discovery information for a plurality of other available pins in the interface. Once the device 102 retrieves this information, the device 102 may program capabilities of pins on the device 102 for further interface compatibility with the peripheral device 104. In other embodiments, each pin on the device 102 may check for a live link to determine which pins are available for interfacing.

Because this is a dynamic configuration, the device pins may change functionality and/or operational state depending on the type of peripheral device 104 interface available. The functionality of a given pin may even change while maintaining a plugged in state with a single peripheral device 104 in some embodiments. In other embodiments, the peripheral device 104 can be configured to add additional cooling capabilities to device 102. Other embodiments are described and claimed.

Device 102 may include one or more wireless transceivers 114, in some embodiments. Each of the wireless transceivers 114 may be implemented as physical wireless adapters or virtual wireless adapters, sometimes referred to as "hardware radios" and "software radios," respectively. A single physical wireless adapter may be virtualized (e.g., using software) into multiple virtual wireless adapters. A physical wireless adapter typically connects to a hardware-based wireless access point. A virtual wireless adapter typically connects to a software-based wireless access point, sometimes referred to as a "SoftAP." For instance, a virtual wireless adapter may allow ad hoc communications between peer devices, such as a smart phone and a desktop computer or notebook computer. Various embodiments may use a single physical wireless adapter implemented as multiple virtual wireless adapters, multiple physical wireless adapters, multiple physical wireless adapters each implemented as multiple virtual wireless adapters, or some combination thereof. The example embodiments described herein are not limited in this respect.

The wireless transceivers 114 may include or implement various communication techniques to allow the device 102 to communicate with other electronic devices. For instance, the wireless transceivers 114 may implement various types of standard communication elements designed to be interoperable with a network, such as one or more communications interfaces, network interfaces, network interface cards (NIC), radios, wireless transmitters/receivers (transceivers), wired and/or wireless communication media, physical connectors, and so forth.

By way of example, and not limitation, communication media includes wired communications media and wireless communications media. Examples of wired communications media may include a wire, cable, metal leads, printed circuit boards (PCB), backplanes, switch fabrics, semiconductor material, twisted-pair wire, co-axial cable, fiber optics, a propagated signal, and so forth. Examples of wireless communications media may include acoustic, radio-frequency (RF) spectrum, infrared and other parts of the spectrum, and other wireless media.

In various embodiments, the device 102 may implement different types of wireless transceivers 114. Each of the wireless transceivers 114 may implement or utilize a same or different set of communication parameters to communicate information between various electronic devices. In one embodiment, for example, each of the wireless transceivers 114 may implement or utilize a different set of communication parameters to communicate information between device 102 and any number of other devices. Some examples of communication parameters may include without limitation a communication protocol, a communication standard, a radio-frequency (RF) band, a radio, a transmitter/receiver (transceiver), a radio processor, a baseband processor, a network scanning threshold parameter, a radio-frequency channel parameter, an access point parameter, a rate selection parameter, a frame size parameter, an aggregation size parameter, a packet retry limit parameter, a protocol parameter, a radio parameter, modulation and coding scheme (MCS), acknowledgement parameter, media access control (MAC) layer parameter, physical (PHY) layer parameter, and any other communication parameters affecting operations for the wireless transceivers 114. The example embodiments described herein are not limited in this respect.

In various embodiments, the wireless transceivers 114 may implement different communication parameters offering varying bandwidths, communications speeds, or transmission ranges. For instance, a first wireless transceiver may include a short-range interface implementing suitable communication parameters for shorter range communication of information, while a second wireless transceiver may include a long-range interface implementing suitable communication parameters for longer range communication of information.

In various embodiments, the terms "short-range" and "long-range" may be relative terms referring to associated communications ranges (or distances) for associated wireless transceivers 114 as compared to each other rather than an objective standard. In one embodiment, for example, the term "short-range" may refer to a communications range or distance for the first wireless transceiver that is shorter than a communications range or distance for another wireless transceiver 114 implemented for the device 102, such as a second wireless transceiver. Similarly, the term "long-range" may refer to a communications range or distance for the second wireless transceiver that is longer than a communications range or distance for another wireless transceiver 114 implemented for the device 102, such as the first wireless transceiver. The example embodiments described herein are not limited in this respect.

In various embodiments, the terms "short-range" and "long-range" may be relative terms referring to associated communications ranges (or distances) for associated wireless transceivers 114 as compared to an objective measure, such as provided by a communications standard, protocol or interface. In one embodiment, for example, the term "short-range" may refer to a communications range or distance for the first wireless transceiver that is shorter than 300 meters or some other defined distance. Similarly, the term "long-range" may refer to a communications range or distance for the second wireless transceiver that is longer than 300 meters or some other defined distance. The example embodiments described herein are not limited in this respect.

In one embodiment, for example, the wireless transceiver 114 may include a radio designed to communicate information over a wireless personal area network (WPAN) or a wireless local area network (WLAN). The wireless transceiver 114 may be arranged to provide data communications functionality in accordance with different types of lower range wireless network systems or protocols. Examples of suitable WPAN systems offering lower range data communication services may include a Bluetooth system as defined by the Bluetooth Special Interest Group, an infra-red (IR) system, an Institute of Electrical and Electronics Engineers (IEEE) 802.15 system, a DASH7 system, wireless universal serial bus (USB), wireless high-definition (HD), an ultra-side band (UWB) system, and similar systems. Examples of suitable WLAN systems offering lower range data communications services may include the IEEE 802.xx series of protocols, such as the IEEE 802.11a/b/g/n series of standard protocols and variants (also referred to as "WiFi"). It may be appreciated that other wireless techniques may be implemented. The example embodiments described herein are not limited in this respect.

In one embodiment, for example, the wireless transceiver 114 may include a radio designed to communicate information over a wireless local area network (WLAN), a wireless metropolitan area network (WMAN), a wireless wide area network (WWAN), or a cellular radiotelephone system. Another wireless transceiver may be arranged to provide data communications functionality in accordance with different types of longer range wireless network systems or protocols. Examples of suitable wireless network systems offering longer range data communication services may include the IEEE 802.xx series of protocols, such as the IEEE 802.11a/b/g/n series of standard protocols and variants, the IEEE 802.16 series of standard protocols and variants, the IEEE 802.20 series of standard protocols and variants (also referred to as "Mobile Broadband Wireless Access"), and so forth. Alternatively, the wireless transceiver 114 may include a radio designed to communicate information across data networking links provided by one or more cellular radiotelephone systems. Examples of cellular radiotelephone systems offering data communications services may include GSM with General Packet Radio Service (GPRS) systems (GSM/GPRS), CDMA/1×RTT systems, Enhanced Data Rates for Global Evolution (EDGE) systems, Evolution Data Only or Evolution Data Optimized (EV-DO) systems, Evolution For Data and Voice (EV-DV) systems, High Speed Downlink Packet Access (HSDPA) systems, High Speed Uplink Packet Access (HSUPA), and similar systems. It may be appreciated that other wireless techniques may be implemented. The example embodiments described herein are not limited in this respect.

Although not shown, device 102 may further include one or more device resources commonly implemented for electronic devices, such as various computing and communications platform hardware and software components typically implemented by a personal electronic device. Some examples of device resources may include without limitation a co-processor, a graphics processing unit (GPU), a chipset/platform control logic, an input/output (I/O) device, computer-readable media, network interfaces, portable power supplies (e.g., a battery), application programs, system programs, and so forth. The example embodiments described herein are not limited in this respect.

In the illustrated example embodiment shown in FIG. 1, the processor(s) 106 may be communicatively coupled to one or more of the memory 108, logic 110, power source 112, transceiver 114, radio 116, antenna 118 and/or SICL 120. The memory unit 108 may store the logic 110 arranged for execution by the processor 106 to enable processing capabilities. The logic 110 may generally provide features to enable any of the functionality described herein. Other embodiments are described and claimed.

The peripheral device 104 may include, for example, an I/O peripheral device designed to interact with device 102. In some embodiments, the I/O devices may include but are not limited to a display, a speaker, a microphone, a projector, a camera, a keyboard, one or more additional input devices (such as a touchpad, touchscreen), and one or more sensors (such as an accelerometer, gyroscope, global positioning system (GPS) logic, infrared motion detector, etc.). Although the peripheral device 104 shown in FIG. 1 has a number of elements in a certain topology, it may be appreciated that the peripheral device 104 may include more or less elements in alternate topologies as desired for a given implementation. For example, any number, type, or arrangement of an I/O device, including devices not shown in FIG. 1, could be used and still fall within the described and claimed embodiments.

The one or more I/O devices may be arranged to provide functionality to the peripheral device 104 and/or the device 102 including but not limited to capturing images, exchanging information, capturing or reproducing multimedia information, receiving user feedback, or any other suitable functionality. Non-limiting examples of input/output devices include a camera, QR reader/writer, bar code reader, buttons, switches, input/output ports such as a universal serial bus (USB) port, touch-sensitive sensors, pressure sensors, a touch-sensitive digital display, and the like. The example embodiments described herein are not limited in this respect.

The peripheral device 104 may include one or more displays in some embodiments. The displays may include any digital display device suitable for an electronic device. For instance, the displays may be implemented by a liquid crystal display (LCD) such as a touch-sensitive, color, thin-film transistor (TFT) LCD, a plasma display, a light emitting diode (LED) display, an organic light emitting diode (OLED) display, a cathode ray tube (CRT) display, or other type of suitable visual interface for displaying content to a user of the device 102 when used in connection with the device 102. The displays may further include some form of a backlight or brightness emitter as desired for a given implementation.

In various embodiments, the displays may include touch-sensitive or touchscreen displays. A touchscreen may include an electronic visual display that is operative to detect the presence and location of a touch within the display area or touch interface. In some embodiments, the display may be sensitive or responsive to contact of the display with a finger or hand. In other embodiments, the display may be operative to sense other passive objects, such as a stylus or electronic pen. In various embodiments, displays may enable a user to interact directly with what is displayed, rather than indirectly with a pointer controlled by a mouse or touchpad. Other embodiments are described and claimed.

While not limited in this respect, in some embodiments the device 102 may include one or more of a wearable device, a control device, a display device, an audio/video (AN) device, a toy device such as a remote control car or a robot device. For example, the device may include a smartwatch device, a TV remote control device, a smart speaker, etc. One of ordinary skill in the art will understand that any suitable device could be arranged as a peripheral device 104 to accommodate device 102 and, as such, the embodiments are not limited to the examples described herein.

In some embodiments, the peripheral device 104 may include a dumb device. More particularly, the device itself may not include components as shown in FIG. 1 as forming part of device 102. For example, peripheral device 104 may not include its own processor, memory, power source, transceiver, etc. Instead, the peripheral device 104 may rely on a device like device 102 for power and processing capabilities. In this manner, any number of peripheral devices could be produced inexpensively and each could be powered and provided with computing capabilities by a common device. Other embodiments are described and claimed.

While not shown herein, in some embodiments, the device 102 may include an independent power supply (e.g. separate and distinct from the power supply of the device) that may power one or more of the components of the peripheral device 104 and/or one or more components of the device 102. Other embodiments are described and claimed.

In example embodiments, device 102 may include power management logic 126. The power management logic 126 may include hardware circuitry, software application(s), firmware code, or a combination of the above types of logic. Power management logic 126 may determine a power state of the device 102, including the processor 106, and potentially other components within device 102. Power management logic 126 can also be configured to scale the power and performance of the device up and down within a specified range. This capability is provided in currently available processor systems. Power management logic 126 may utilize many different inputs to determine a context of the device 102. Context of the device 102 may be considered in determining a power management policy, e.g., what power state, condition, or level (e.g., wake/sleep state) each component is to be in at any given time. Power management logic 126 may utilize sensor input from sensor(s) 122 and SICL 120, and/or activity levels from a user or from other applications running on an OS such as OS 112A, among other inputs to determine the context of the device 102. Additionally, power management logic 126 may utilize environmental sensor input from sensor(s) 122 to measure the ambient temperature, humidity, altitude/elevation, GPS location, time of day, etc. This input can be used to further refine the context used by the power management logic 126 to configure the operation of the device 102. Moreover, the context can be further refined to include user identity information and related profile information to configure the operation of the device 102 based on the particular preferences of a specific user. Thus, the power management logic 126 can use the context to configure the operation of the device 102, for example, to operate at a particular processing performance level and/or at a particular $T_{skin}$ temperature based on the preferences of a specific user of the device 102.

In example embodiments, device context-based power and performance management (PM) is described. Device context may refer to a combination of device position (e.g., vertical, horizontal, horizontal with air flow, vertical with air flow), device contact state (e.g., whether the device is free from human contact or in physical contact with a human), and docking state (whether or not the device is docked, and whether active cooling is being provided). Different device contexts may influence device platform thermal constraints. The PM policy may react to the device context changes and may manage power and thermal state decisions, e.g., to enhance or otherwise modify processor performance or to modify the $T_{skin}$ of the device. Additionally, a device context-based PM infrastructure may monitor performance and power consumption of software applications and may offer suggestions (e.g., via a user interface) to an end user, e.g., to improve performance or battery life of the platform. Additionally, the user interface may provide to the user an indication of whether the performance or the battery life of the platform is improved responsive to user-executed changes to the device context, e.g., change in device orientation, contact with a human being, proximity to active cooling, flow rate of a coolant proximate to the device, etc. For example, the user interface may include a color indicator that may correspond to a thermal characteristic of the device, e.g., operating temperature of a processor of the device. The device 102 platform may have a thermal dissipation limit (TDP), e.g., a high temperature operating characteristic of the device 102 that is typically higher than a temperature of an exterior (skin) of the device 102 ($T_{skin}$). By relaxing the $T_{skin}$, e.g., to enable $T_{skin}$ to exceed determined constraints, higher performance may be extracted from the system. By utilizing device contextual information to determine whether to relax $T_{skin}$, the PM policy may improve the performance of the system.

Figure 5:
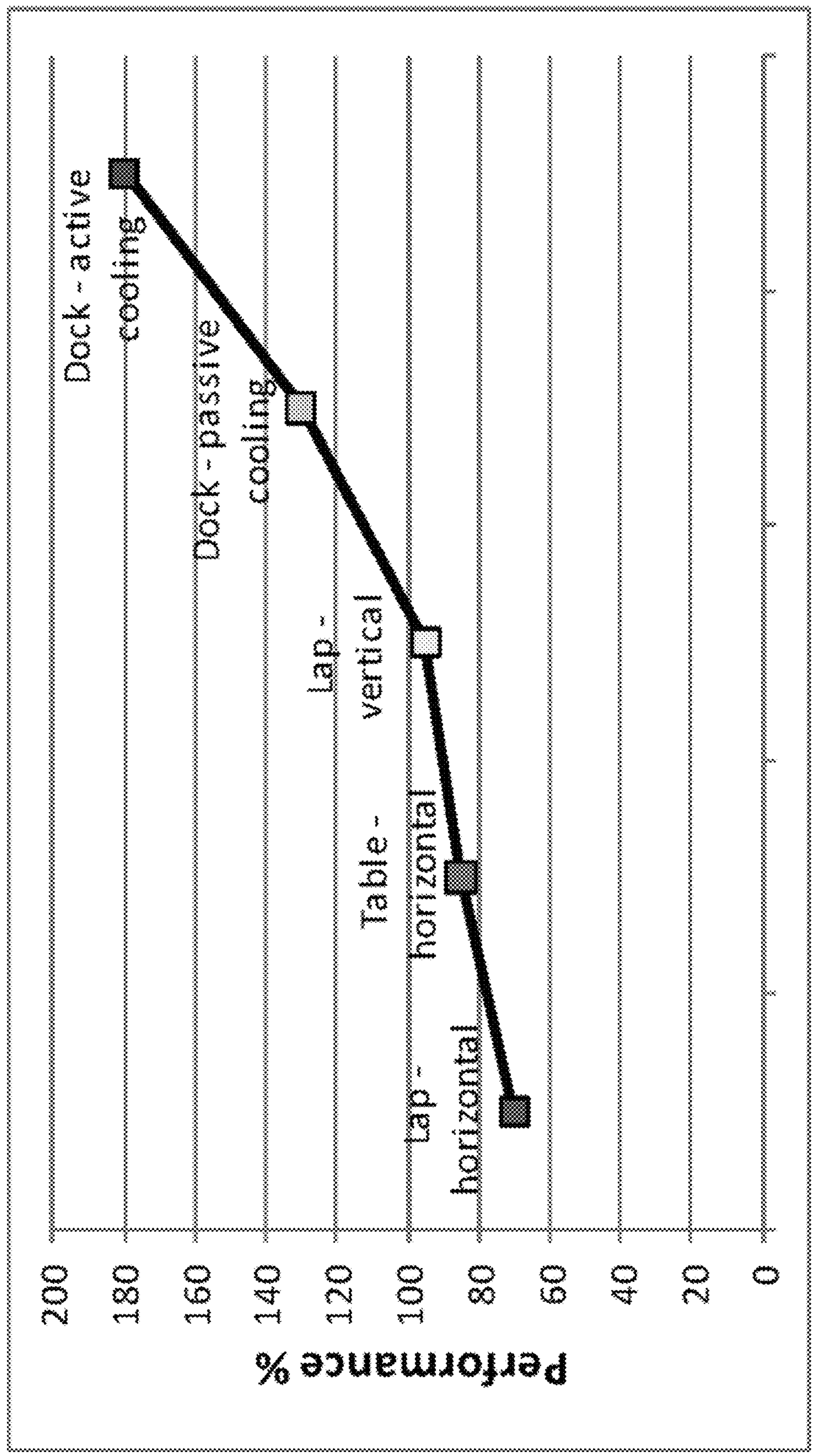
FIG. 5 is a graph illustrating an example of performance scalability for the same workload on a given processor under different usage scenarios.

Modern data processors may have significant capabilities for performance scaling. For instance, many processors can deliver significantly higher performance than their nominal performance level if the thermal constraints of the platform can be increased from a configured TDP (cTDP). The graph shown in FIG. 5 illustrates an example of performance scalability for the same workload on a given processor under different usage scenarios. Some workloads scale very well with an increase in platform cTDP. These workloads can benefit substantially from active cooling docks, different system orientations, etc. Contextual PM leverages the performance scalability of a processor and may result in significant performance gains, depending on the context of the device.

In example embodiments, a current platform PM policy may be determined as follows: PM policy=function (device orientation, device contact state, device dock state). Variables that are input to determine the PM policy may include, but are not limited to: device orientation, device contact state, and device dock state. Each of device orientation, device contact state, and device dock state is further described below.

Device Orientation: In example embodiments, an orientation of the device may be utilized to help determine the PM policy. Device orientation with respect to an orientation standard (e.g., horizontal, vertical, gravitational vertical, or other orientation standard) may be inferred based on position sensors such as accelerometers, inclinometers, gyroscopes, etc. For example, the position sensors can provide information as to whether the device is substantially in a horizontal orientation or a vertical orientation with respect to an orientation standard. For instance, the device may be positioned horizontally on, e.g., a table or desk with no air flow to cool the device. In some embodiments, the device may be positioned horizontally or angled with respect to horizontal, and permitting airflow that enables some heat transfer to surrounding air.

In a vertical orientation, the device is positioned vertically due to, e.g., a user holding the device, or the device being leaned against a wall, or the device being coupled to a dock, or by another means of positioning the device. The vertical orientation permits surrounding hot air to rise due to convection, e.g., between a core heat sink and a top-plate, and may enable heat to transfer from the processor to an exterior skin of the device. In a vertical position with active cooling, the device may be attached to a dock or base with active cooling capability. Active cooling refers to, e.g., one or more fans, or a mechanism to circulate a heat conductive agent (e.g., gas or liquid) that can remove heat from the device, etc., to reduce $T_{skin}$ of the platform.

Device Contact State: Physical contact with a human being (e.g., user) may be inferred through analysis of data from one or more sensors such as a Specific Absorption Rate (SAR) sensor, accelerometer, gyro sensor, touch sensor, etc. The SAR sensor can output data indicating whether an object that is in close proximity to the sensor is human skin, or wood, air, etc. Some SAR sensors operate according to capacitive proximity measurement. An advantage of knowing whether or not a human is proximate is that when the human is not holding the device, $T_{skin}$ can be allowed to scale higher, permitting increased performance of the device. In other cases, device performance and $T_{skin}$ can be managed to achieve a comfortable temperature level for a user if a user is in contact with the device.

Because a SAR sensor typically has a granularity of a few centimeters of accuracy, it may not be reliable to use as a sole sensor by which to determine whether the device is in close proximity/physical contact with a human being. Alternatively, a plurality of sensor measurements may be recorded from another sensor (e.g., an inclinometer that determines orientation with respect to an orientation standard) over a defined time period. Because it is very difficult for humans to hold an item still (e.g., at a fixed orientation) without moving or touching a device display screen, measurements recorded over time may be analyzed to determine whether the user is holding the device. For example, the measurements recorded may be data that includes a plurality of orientation measurements received from the inclinometer, each orientation measurement taken at a distinct time over a defined time period. The measurements may be recorded in serial fashion, e.g., periodically over the defined time period. The logic may determine whether the apparatus is in physical contact with the user based at least in part on a comparison of a standard deviation of the sensor measurements, to a threshold value, e.g. threshold standard deviation.

Alternatively, by receiving data from several sensors (e.g., two or more of SAR, accelerometer, inclinometer, gyroscope, etc.), physical proximity to a human may be able to be inferred with greater accuracy than from SAR data alone. For instance, data from each of two or more sensors may be evaluated, e.g., statistically using standard deviation of the respective data from each of the sensors, to infer whether there is physical contact between the device and a human (e.g., the user).

In some embodiments, sensor data may be received from a "virtual sensor," e.g., data received from several sensors (e.g., "fused sensors"), which in combination emulates another sensor. For example, sensor data received from an accelerometer, a gyroscope, and a compass may be analyzed statistically. In one embodiment, data received (e.g., periodically) from each of the fused sensors during a defined time period may be analyzed to determine a corresponding standard deviation. The standard deviations of each of the fused sensors, as determined by statistical analysis, may be combined and compared with an overall threshold, (e.g., an overall standard deviation threshold), to determine whether the device is being held by a human being.

Device Dock State: Diverse instantiations of docks and peripheral devices may be available to a system to deliver an enhanced user experience. By virtue of placing the electronic device in a dock or coupling to a docking interface, the cTDP of the platform may change and with it, the scope to deliver a contextual performance boost. Information on the type of dock (if any) attached, may be obtainable from an embedded controller (EC) on the platform. A dock with active cooling refers to a dock that has fans or other mechanisms to actively cool the platform by removing heat from the system. On docks with fans for active cooling, contextual PM policy may be able to adjust air speed (e.g., fan speed) dynamically, depending on platform requirements and dock capabilities. Two examples of fan control policies are described below.

In one example of fan control policies, fan speed of a fan on the dock can be increased linearly with performance requirements of a system. Fan speed can also be controlled non-linearly, or using a smart controller with feedback. If the system is performing at close to full utilization, then fan speed can be ramped up to the maximum levels to support cooling of the platform. Fan speed of the dock can be adjusted depending on ambient noise. For example, if the system is in an office environment with minimum ambient noise, fan speed may be lowered to be less audible to the end user. In circumstances where the ambient noise is significant, fan speed can be ramped up to improve cooling of the platform. It is to be noted that the dock's effectiveness is dependent to a large degree on the system design and thermal characteristics of the (detachable) electronic device. For example, if a battery is placed at a center of the system to absorb heat generated by a system on a chip (SoC), thermal conductivity at edges of the device may be improved as compared with other battery placements. Docks with active cooling may be designed in conjunction with system design to enhance platform cooling for the specific device. Undocked refers to a system that is not currently placed in any dock nor coupled to a docking interface and is in a stand-alone mode.

In another example of fan control policies, a hybrid outer plate of the computing system platform can be provided in which plastic is used around edges of the device and metal is used in the interior portions, so that heat becomes less of a factor around the edges. For example, plastic typically feels cooler to a user than metal does; so, the $T_{skin}$ can be raised in the portions of the device where there is plastic.

Figure 2:
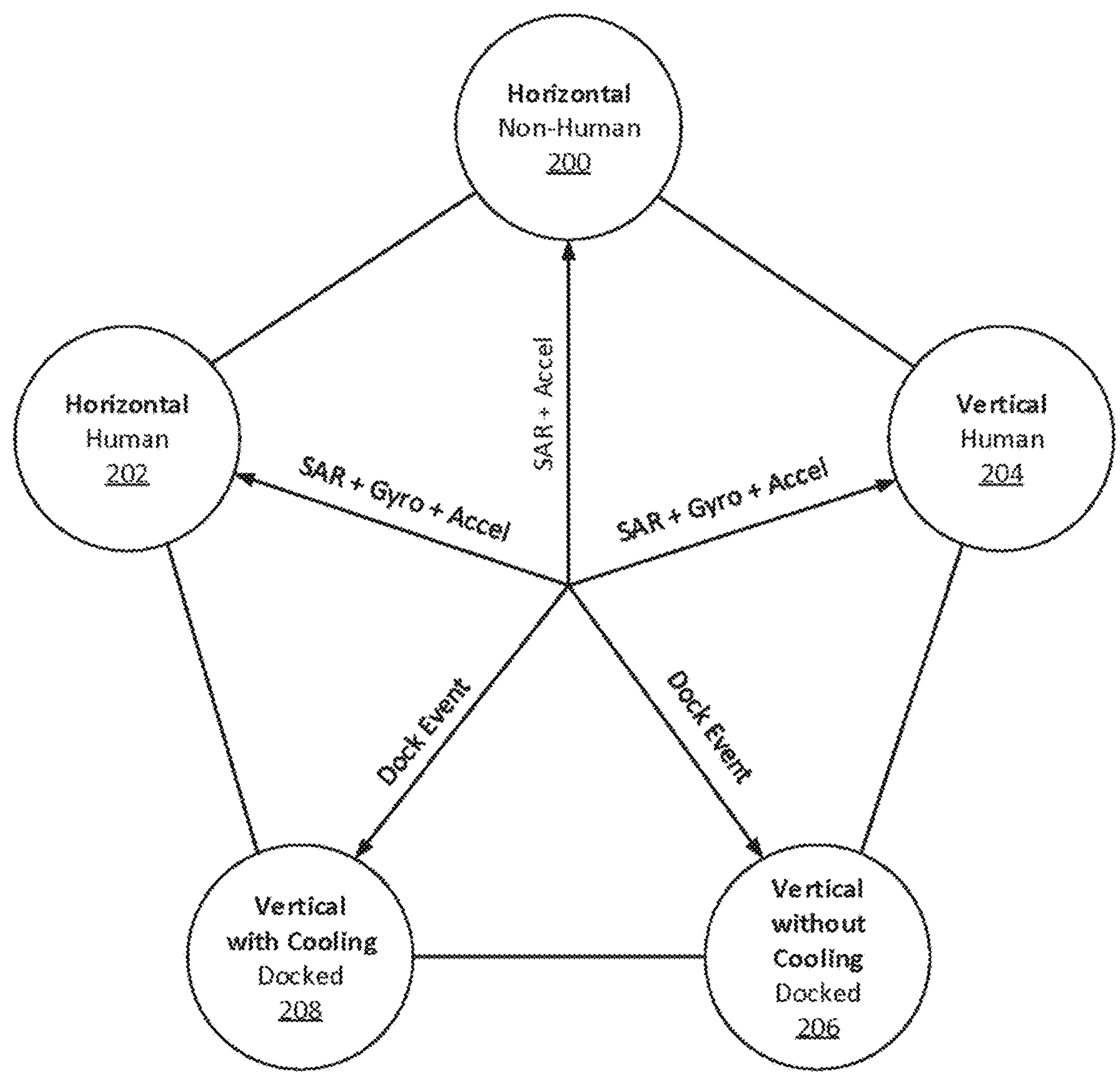
FIG. 2 is a diagram depicting states of a state machine, according to an example embodiment.

FIG. 2 is a diagram depicting states of a state machine, according to an example embodiment. A horizontal/non-human contact state 200 can be determined by system sensors, such as a SAR sensor and/or accelerometer data that provide information to PM logic. A horizontal/human contact state 202 can be determined by system sensors such as SAR, gyroscope, and/or accelerometer, providing information to the PM logic. A vertical/human contact state 204 can be determined by system sensors such as SAR, gyroscope, and/or accelerometer, providing information to the PM logic. A vertical/no active cooling (non-human contact) docked state 206 can be determined by a docking event that provides information to the PM logic. A vertical/active cooling docked state 208 can be determined by a docking event that provides information to the PM logic. Data provided by sensors may be received and transmitted through sensor and I/O (input/output) control logic e.g., the SICL 120 of FIG. 1.

Figure 3:
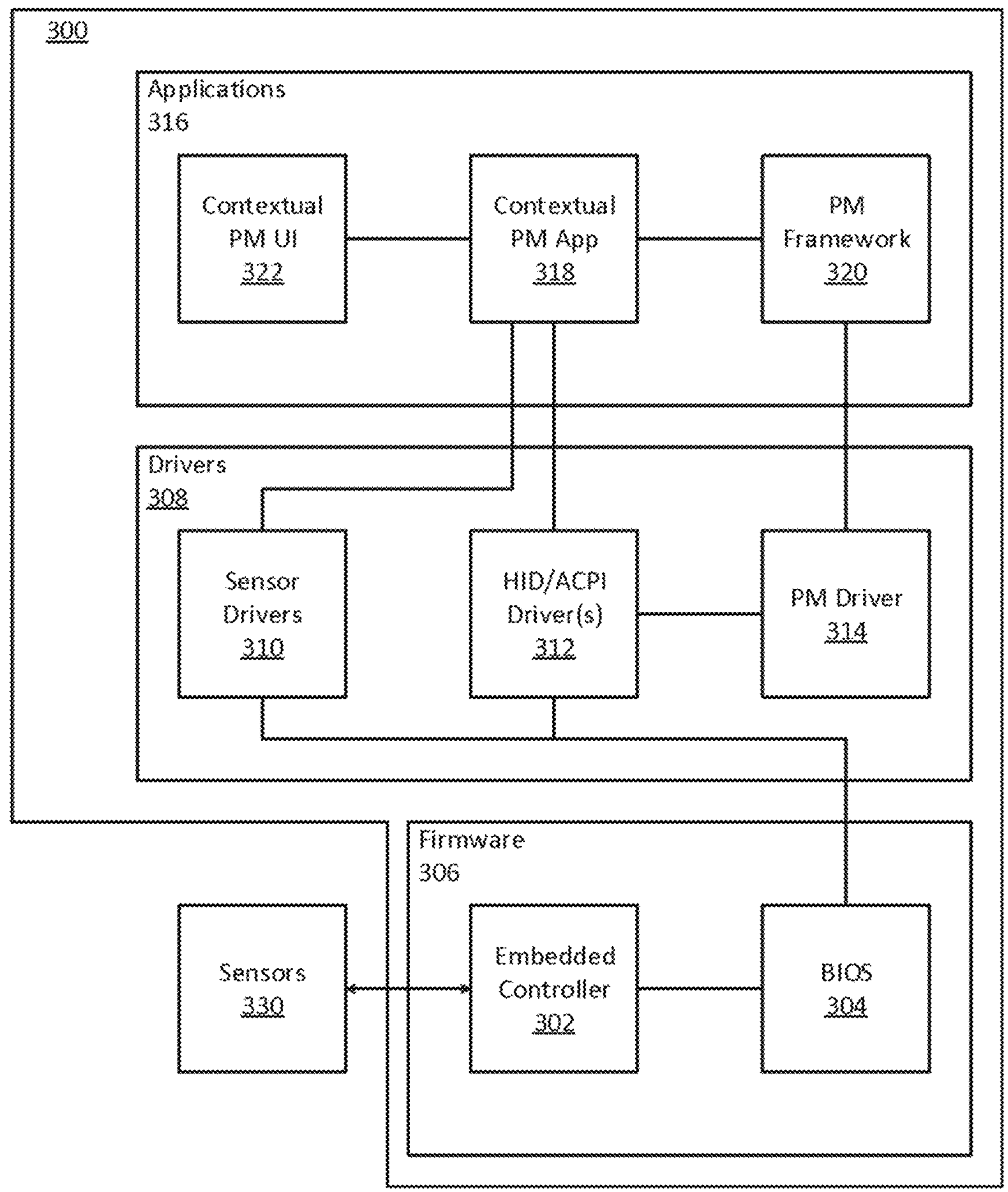
FIG. 3 is a block diagram of logic utilized to provide contextual information to power management logic of a device, according to an example embodiment.

FIG. 3 is a block diagram of logic utilized to provide contextual information to power management logic of a device, according to an example embodiment. Device sensors 330 may send sensor information input to logic 300, e.g., through a SICL (e.g., SICL 120 of FIG. 1), which in example embodiments may include firmware logic 306 that can include an embedded controller 302 that may be configured through a basic input/output system (BIOS) 304.

The sensor information is then sent to a driver layer 308 that may include sensor drivers 310, human interface device (HID)/Advanced Configuration and Power Interface (ACPI) drivers 312, and/or a power management driver 314. The driver layer 308 may notify an applications layer 316 registered for the input with the data from the sensors 330. Contextual PM application logic 318 may receive the sensor data to manage a state machine whose state depends on device context. The contextual PM application logic 318 may provide, to a PM framework 320, power state recommendations, instructions, or commands for one or more components of the device, based on the device context that includes one or more parameters, e.g., whether the device is in physical contact with a human (e.g., user), orientation of the device, proximity to external air flow or other heat removing mechanisms, speed of external air flow, etc. The PM framework 320 may adjust power supplied to the one or more components of the device based on the recommendations, instructions, or commands received from the PM application logic 318. Additionally, a contextual PM user interface 322 may be user-visible to present recommendations to a user from, e.g., the PM application logic 318, and to allow a user to manually change the PM policy. Additionally, the contextual PM user interface 322 may be operable to provide to the user an indication as to the effectiveness in heat removal from the device based on changes implemented by the user or the system.

Figure 4:
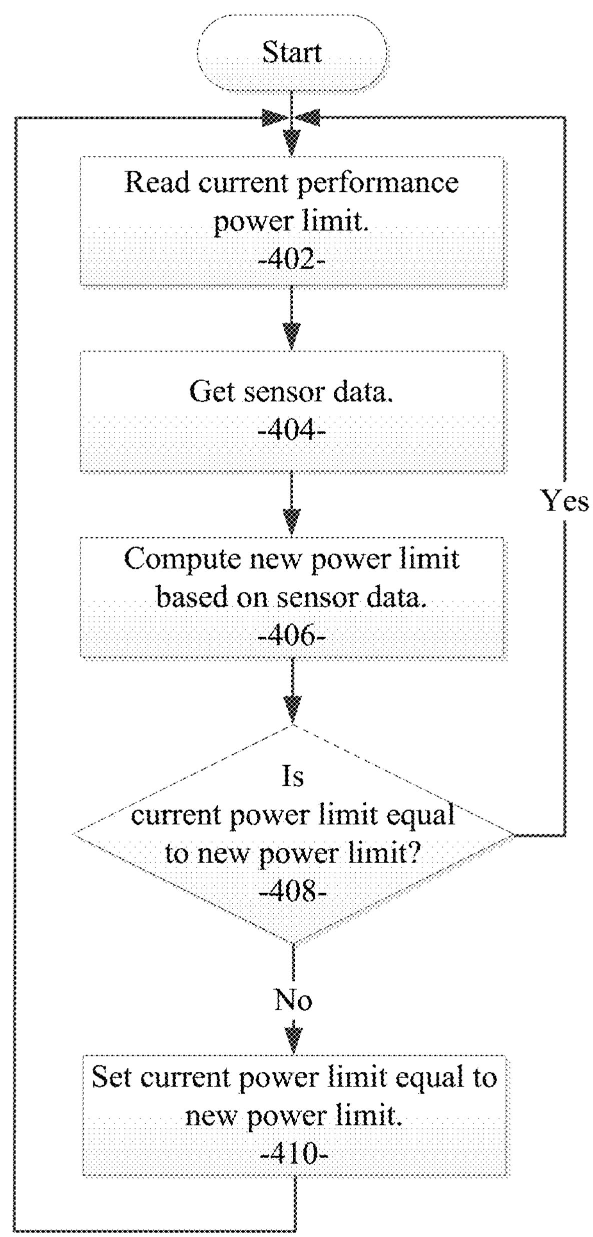
FIG. 4 is a flow diagram of a method including logic flow, according to an example embodiment.

FIG. 4 is a flow diagram of a method including logic flow, according to an example embodiment. Logic flow 400 may be managed by processing logic (such as the logic 300 described above), which can be one or more of hardware, software, and firmware logic. At block 402, the processing logic reads a current performance power limit. Continuing to block 404, the processing logic retrieves sensor data, e.g., from one or more context sensors such as SAR, gyroscope, inclinometer, accelerometer, etc. Advancing to block 406, the processing logic computes a new power limit of the device based on the sensor data. Proceeding to decision block 408, processing logic determines whether the current power limit is equal to the computed new power limit. If the current power limit is equal to the new power limit, the process returns to block 402. If the current power limit is not equal to the new power limit, continuing to block 410, the processing logic sets the current power limit to the new power limit and returns to block 402.

In some embodiments, a contextual PM application can observe performance and battery life metrics corresponding to the application and system level components and can provide suggestions to end users regarding adjustments to improve performance or battery life. For example, a user may be holding a portable device horizontally and playing a game. The contextual PM application may determine that a horizontal orientation is not optimal for heat dissipation and may suggest to the user (e.g., via a user interface) that the user hold the system more vertically, or that the user place the system on a vertically oriented dock. In some embodiments, the suggestion may be presented in a non-intrusive fashion, e.g., a visual indicator on a taskbar that changes color (from green to yellow or to amber) to indicate that the device may be warmer in its current device context than if the device context were changed, e.g., by change of device orientation, or change of contact with the user, or introduction of active cooling. Such a visual indicator may influence the user to adjust one or more usage parameters (e.g., device orientation, contact with the user, external airflow or other external cooling) to improve device performance and/or battery life.

Included herein is a set of logic flows representative of example methodologies for performing novel aspects of the disclosed architecture. While, for purposes of simplicity of explanation, the one or more methodologies shown herein are shown and described as a series of acts, those of ordinary skill in the art will understand and appreciate that the methodologies are not limited by the order of acts. Some acts may, in accordance therewith, occur in a different order and/or concurrently with other acts from those shown and described herein. For example, those of ordinary skill in the art will understand and appreciate that a methodology could alternatively be represented as a series of interrelated states or events, such as in a state diagram. Moreover, not all acts illustrated in a methodology may be required for a novel implementation. A logic flow may be implemented in software, firmware, and/or hardware. In software and firmware embodiments, a logic flow may be implemented by computer executable instructions stored on at least one non-transitory computer readable medium or machine readable medium, such as an optical, magnetic or semiconductor storage. The example embodiments disclosed herein are not limited in this respect.

The various elements of the device 102 as previously described with reference to the figures may include various hardware elements, software elements, or a combination of both. Examples of hardware elements may include devices, logic devices, components, processors, microprocessors, circuits, processors, circuit elements (e.g., transistors, resistors, capacitors, inductors, and so forth), integrated circuits, application specific integrated circuits (ASIC), programmable logic devices (PLD), digital signal processors (DSP), field programmable gate array (FPGA), memory units, logic gates, registers, semiconductor device, chips, microchips, chip sets, and so forth. Examples of software elements may include software components, programs, applications, computer programs, application programs, system programs, software development programs, machine programs, operating system software, middleware, firmware, software modules, routines, subroutines, functions, methods, procedures, software interfaces, application program interfaces (API), instruction sets, computing code, computer code, code segments, computer code segments, words, values, symbols, or any combination thereof. However, determining whether an embodiment is implemented using hardware elements and/or software elements may vary in accordance with any number of factors, such as desired computational rate, power levels, heat tolerances, processing cycle budget, input data rates, output data rates, memory resources, data bus speeds and other design or performance constraints, as desired for a given implementation.

In particular example embodiments described herein, an accessory in the form of a dock with active cooling (e.g., fan or blower) can be provided. As described in more detail below, an adaptive performance capability provided by a contextual PM system as described above can detect the presence of active cooling in a dock and allow the SOC in a system platform of an electronic device inserted into the dock to scale up to a higher processing performance level based on a revised thermal envelope determined by surface cooling of the inserted system. The forced airflow over the exterior of the electronic system inserted into the active cooling dock can compensate for increased thermal dissipation due to the SOC operating at higher performance levels, without violating the skin temperature requirements for the inserted electronic system. As a result, the active cooling can decrease the skin temperature of the inserted electronic system and the temperature of the processor therein.

In an example embodiment, the inserted system can be, for example, a 2-in-1 detachable computing system, which may include, for example, an Intel® Core SOC. Current 2-in-1 computing systems are designed to be thin, closed, fan-less systems, with limited thermal headroom, which constrains the SOC performance to levels significantly below their maximum allowable limits. An example embodiment described herein can provide an accessory device for the 2-in-1 computing system, or other electronic device, which provides an increased thermal envelope allowing the SOC in the 2-in-1 computing system to scale up to higher performance levels. This extra processing performance can be configured and used by the user as needed, without compromising the thin and light 2-in-1 computing experience.

Figure 6:
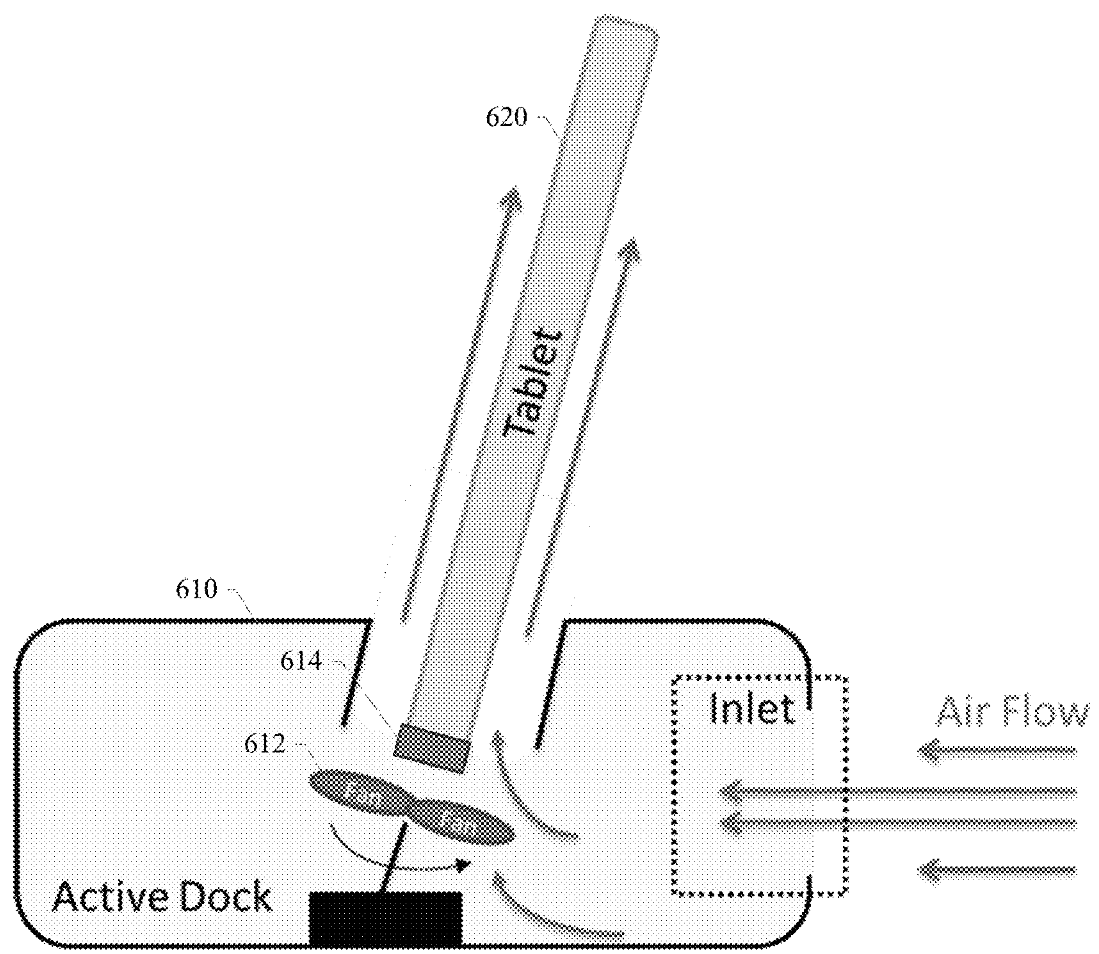
FIG. 6 illustrates an example embodiment of a dock configured as an attachable mobile base or stationary dock with active cooling.

Referring now to FIG. 6, an example embodiment of a dock 610 configured as an attachable mobile base or stationary dock with active cooling is illustrated. As shown in FIG. 6, the dock 610 uses an air-moving device 612 (e.g., a fan), which provides forced airflow over a passively cooled electronic device (e.g., a tablet) 620 removably inserted into an opening in the dock 610. In the configuration shown in FIG. 6, the air-moving device 612 can pull air into an inlet of the dock 610 and direct the airflow laterally across the front and back of the inserted electronic device 620 as shown. The lateral airflow general denotes the movement of air adjacent and parallel to the larger dimension surfaces of the inserted electronic device 620. The airflow over the larger dimension surfaces of the inserted electronic device 620 (e.g., the front of the touch panel and back of the chassis) increases the heat transfer rate of the electronic device 620 surfaces by converting natural convection into forced convection heat transfer. As a result, the electronic device 620 can be cooled more efficiently. Baffles can be installed in the dock 610 and used in conjunction with the air-moving device 612 to orient the airflow along the larger dimension surfaces of the inserted electronic device 620.

As provided in most docking systems, the dock 610 can also include an electrical interface 614 into which the electronic device 620 can be plugged while inserted into the dock 610. The electrical interface 614 can be as simple as a mere power interface for charging the electronic device 620 while the device is inserted into the dock 610. In other embodiments, the electrical interface 614 can be a power and data interface to couple the electronic device 620 with electrical devices, ports, controllers, or processors provided in the dock 610. In still other embodiments, the electrical interface 614 can be a wireless data interface to couple the electronic device 620 wirelessly with electrical devices, ports, controllers, or processors provided in the dock 610. In any of these example embodiments, the electrical interface 614 can be used by a dock detection subsystem in the electronic device 620 to detect when the electronic device 620 is inserted in the dock 610. A data interface (if any) provided by the electrical interface 614 can further provide an exchange of data between the dock 610 and the inserted device 620. The exchanged data can include information specifying a type of dock 610, a profile of dock 610, or other information the electronic device 620 can use to determine a context associated with the particular dock 610. As a result, the contextual PM system of an example embodiment can configure the performance level of a processor on the electronic device 620 based on the particular capabilities of the dock 610 into which the electronic device 620 is inserted. These features of an example embodiment are described in more detail below in connection with FIG. 7.

Figure 7:
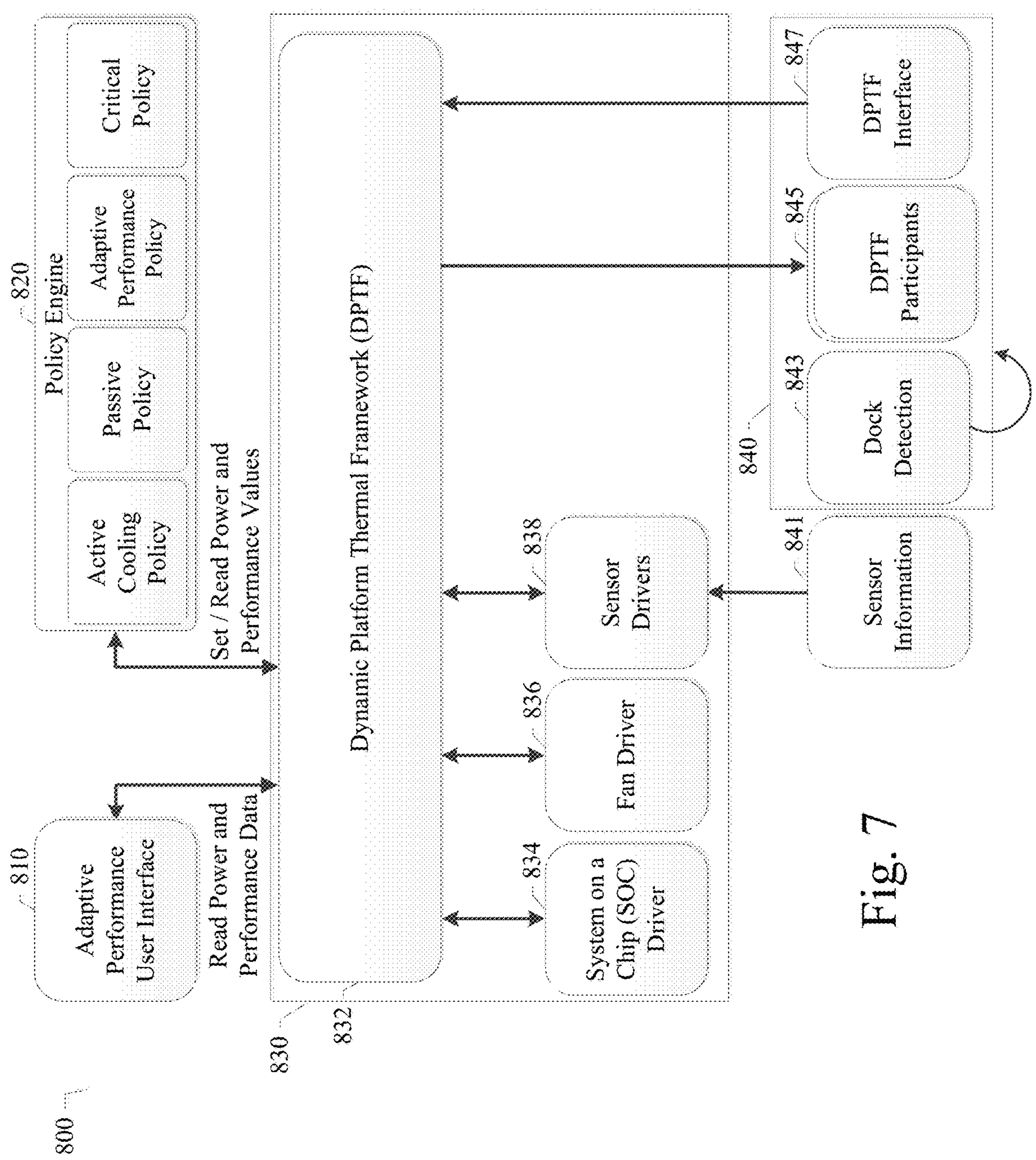
FIG. 7 illustrates a high level architecture of a DPTF (Dynamic Platform Thermal Framework) integrated with adaptive performance, according to an example embodiment.

FIG. 7 illustrates a high level architecture 800 of a DPTF (Dynamic Platform Thermal Framework) integrated with adaptive performance, according to an example embodiment. Using the techniques described herein, an adaptive performance solution can be integrated into a DPTF system to enable adaptive thermal and performance management in electronic devices, particularly mobile computing devices. As such, the architecture can be denoted an adaptive thermal and performance management framework. The adaptive thermal and performance management framework of an example embodiment can include logic utilized to provide contextual information to power management logic of an electronic device, according to an example embodiment.

As shown in FIG. 7, device sensors may send sensor information input 841 to logic 830, e.g., through a SICL (e.g., SICL 120 of FIG. 1). In the example embodiment shown in FIG. 7, the logic 830 can be a software layer, which includes a plurality of drivers, such as sensor drivers 838, fan driver 836, and SOC driver 834. It will be apparent to those of ordinary skill in the art in view of the disclosure herein that a variety of drivers can be similarly provided as part of logic 830. The sensor driver 838 can receive the sensor information 841 from the device sensors. The drivers can interface with the DPTF logic 832. In the example embodiment, the DPTF logic 832 or adaptive thermal and performance management subsystem represents a software layer module configured to implement the context-based power and performance management features as described above. In particular, the DPTF logic 832 can receive sensor information 841, determine a corresponding context, and implement an appropriate policy for any of a plurality of DPTF participants. The DPTF participants can be in data communication with DPTF logic 832 via DPTF participant logic blocks 845 and DPTF interface 847, which in example embodiments may include firmware logic that can be configured through a basic input/output system (BIOS) 840. The BIOS 840 can also include a dock detection logic block 843, which can detect the insertion or removal of the electronic device into or from the dock 610 as described above. The DPTF logic 832 may receive the sensor data, dock detection data, SOC state, fan state, and DPTF participant information as described above for use in managing a state machine in which state depends on device context as developed from these various inputs. The DPTF logic 832 can use this determined device context to select from a plurality policy engines 820 that conform to the current device context.

In an example embodiment, these policy engines can include an active cooling policy, a passive policy, a critical policy, and an adaptive performance policy. In a system without adaptive performance, the system can use the active cooling policy, the passive policy, and the critical policy to successively deal with thermal issues. For example, consider a laptop computer with a built-in cooling fan. If thermals rise, the DPTF logic 832 can first attempt to use the active cooling policy to deal with the thermal issues; because, this type of resolution results in the least amount of performance reduction. If the active cooling policy cannot resolve the thermal issues based on detected temperature levels, the DPTF logic 832 can apply the passive policy, which does lower power limits of various system components, like the processor, and therefore can impact system performance. Finally, if the DPTF logic 832 detects a thermal runaway situation, which can't be addressed by the active cooling and passive policies, the DPTF logic 832 can take drastic actions with the critical policy. These actions can include causing the system to hibernate or to shut completely down. Typically, such a critical situation may occur if the system has been left running unattended in a closed space.

In a system supporting an adaptive performance policy (AP policy) as described herein, the AP policy is responsible for the setting revised power and skin temperature ($T_{Skin}$) limits, based on the device context. Every time the device context changes, the AP policy can be activated to change the system power and thermal parameters, relevant to the context. After the new parameters are set, the active cooling policy, the passive policy and the critical policy as described above continue to be used to manage system thermal issues. The device context (e.g., docked with active cooling) can enable the adaptive performance policy to set higher thresholds for $T_{Skin}$ and power/performance levels. The active cooling policy can then maintain the new thresholds by managing the cooling device. It can be expected that an electronic device inserted into a dock with active cooling can be configured to ramp up (increase) to a higher level of power and/or performance based on the improved ability of the device to dissipate heat. In contrast, it can be expected that the electronic device can be configured to maintain a current level of power and/or performance or perhaps ramp down (decrease) to a lower level of power and/or performance based on the decreased ability of the device to dissipate heat. Similarly, the critical policy can be used to cause the electronic device to ramp down to a lower level of power and/or performance more quickly based a detection of a level of heat nearing a threshold limit. Moreover, the critical policy can be used to shut down systems when components reach critical thresholds.

The adaptive performance policy can cause the DPTF logic 832 to periodically read and set appropriate power and performance values for the subsystems of the electronic device when the device is subject to a changing thermal environment or variable processing demands. The DPTF logic 832 can dynamically respond to the real-time demands of the processing load and the thermal environment in which the electronic device is operating. Thus, the DPTF logic 832 may provide power and/or performance state recommendations, instructions or commands for one or more subsystems or components of the electronic device, based on the device context that includes one or more parameters, e.g., whether the device is in physical contact with a human (e.g., user), orientation of the device, proximity to external air flow or other heat removing mechanisms, speed of external air flow, etc. The DPTF logic 832 may adjust power supplied to or performance levels of the one or more subsystems or components of the electronic device based on the power/performance and $T_{Skin}$ limits set by the adaptive performance policy, relevant to the particular device context. Additionally, an adaptive performance user interface 810 may be provided and made user-visible to present recommendations to a user from, e.g., the DPTF logic 832, and to allow a user to manually change the PM policy. Additionally, the adaptive performance user interface 810 may be operable to provide to the user an indication as to the effectiveness in heat removal from the device based on the changes implemented by the user or the system.

The various embodiments described herein are unique in a variety of ways. In particular, an example embodiment can implement adaptive performance, wherein a software solution can detect the presence of a dock with active cooling and dynamically scale up SOC power and performance levels of electronic devices inserted therein. Users of the inserted electronic devices can benefit from approximately a 30% increase in SOC performance as compared to device performance in a standard mode. For example, on an Intel® Core M-Series processor based 2-in-1 detachable electronic system, which is typically less than 8 mm thick, closed, and fan-less, a significant increase in the thermal envelope can be achieved, while maintaining a safe device skin temperature, when the device is docked with active cooling. Moreover, the adaptive thermal and performance management features of the various example embodiments described herein can provide among the following additional advantages:

- Dynamic and instant SOC performance scalability without any system redesign.
- The adaptive thermal and performance management features can be made available as needed by the user, without unduly compromising battery life. In particular, by adapting maximum power limits on as needed basis, the user can save on battery life.
- No thermal considerations need to be factored into an original electronic system design to still obtain the advantages of the increased SOC TDP as disclosed herein.
- Can be implemented for any fan-less electronic device without any impact or change to the internal design of the device, unlike internal cooling which requires vents/ways to direct airflow.

It will be apparent to those of ordinary skill in the art in view of the disclosure herein that a variety of alternative usage models can also be employed. Thus, the various embodiments described herein provide systems and methods for adaptive thermal and performance management in electronic devices.

The example embodiments described herein provide a technical solution to a technical problem. The various embodiments improve the functioning of the electronic device by providing systems and methods for adaptive thermal and performance management in an electronic device. The various embodiments also serve to transform the state of various system components based on a dynamically determined system context. Additionally, the various embodiments effect an improvement in a variety of technical fields including the fields of dynamic data processing, thermal regulation, mobile computing, information sharing, and mobile communications.

Figure 8:
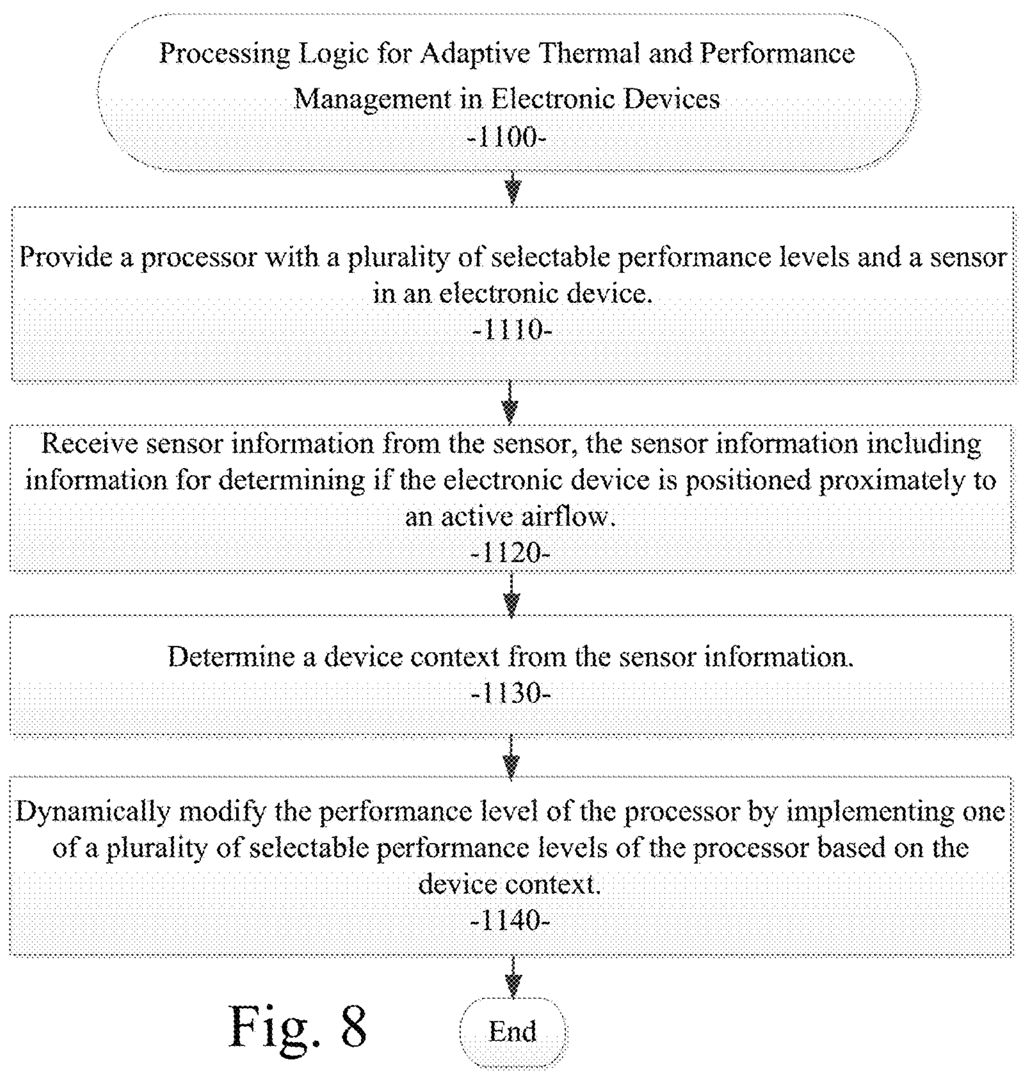
FIG. 8 is a processing flow chart illustrating an example embodiment of a method as described herein.

Referring now to FIG. 8, a processing flow diagram illustrates an example embodiment of a method 1100 for a method as described herein. The method 1100 of an example embodiment includes: providing a processor with a plurality of selectable performance levels and a sensor in an electronic device (processing block 1110); receiving sensor information from the sensor, the sensor information including information for determining if the electronic device is positioned proximately to an active airflow (processing block 1120); determining a device context from the sensor information (processing block 1130); and dynamically modifying the performance level of the processor by implementing one of a plurality of selectable performance levels of the processor based on the device context (processing block 1140).

Figure 9:
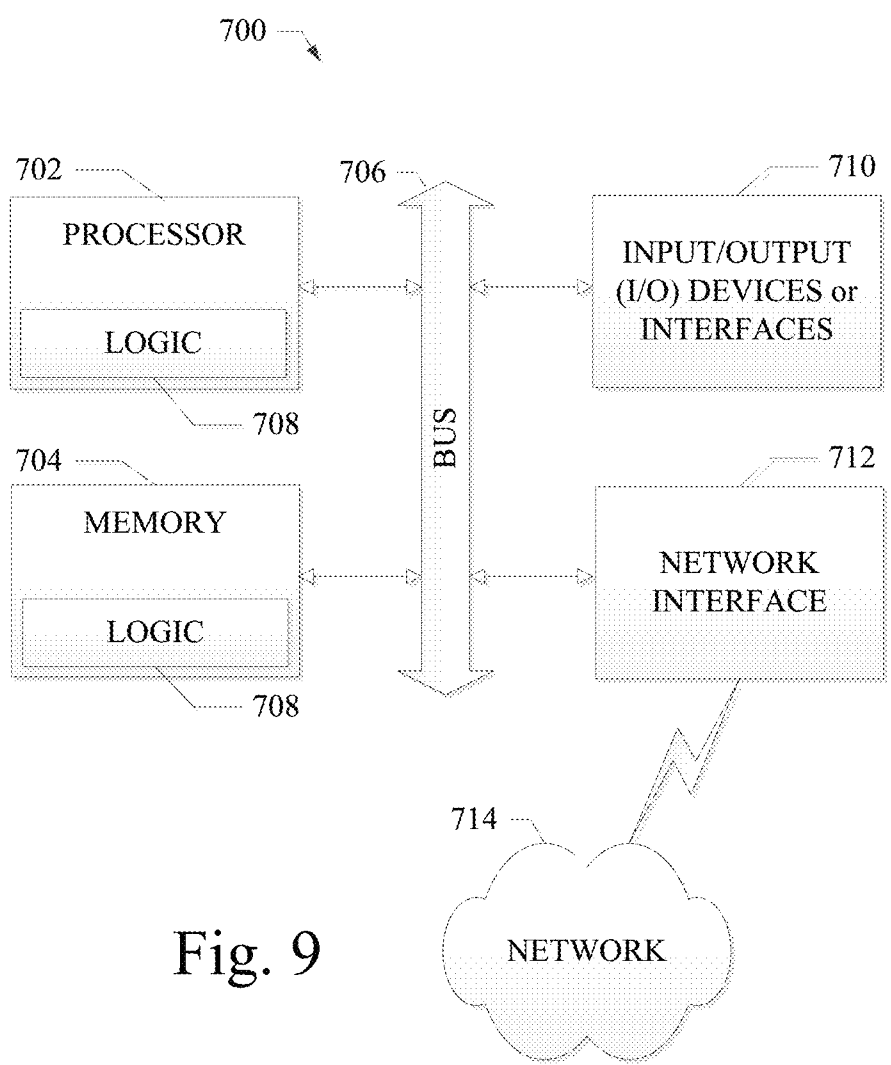
FIG. 9 shows a diagrammatic representation of a machine in the example form of a mobile computing and/or communication system within which a set of instructions when executed and/or processing logic when activated may cause the machine to perform any one or more of the methodologies described and/or claimed herein.

FIG. 9 shows a diagrammatic representation of a machine in the example form of an electronic device, such as a mobile computing and/or communication system 700 within which a set of instructions when executed and/or processing logic when activated may cause the machine to perform any one or more of the methodologies described and/or claimed herein. In alternative embodiments, the machine operates as a standalone device or may be connected (e.g., networked) to other machines. In a networked deployment, the machine may operate in the capacity of a server or a client machine in server-client network environment, or as a peer machine in a peer-to-peer (or distributed) network environment. The machine may be a personal computer (PC), a laptop computer, a tablet computing system, a Personal Digital Assistant (PDA), a cellular telephone, a smartphone, a web appliance, a set-top box (STB), a network router, switch or bridge, or any machine capable of executing a set of instructions (sequential or otherwise) or activating processing logic that specify actions to be taken by that machine. Further, while only a single machine is illustrated, the term "machine" can also be taken to include any collection of machines that individually or jointly execute a set (or multiple sets) of instructions or processing logic to perform any one or more of the methodologies described and/or claimed herein.

The example mobile computing and/or communication system 700 includes a data processor 702 (e.g., a System-on-a-Chip [SoC], general processing core, graphics core, and optionally other processing logic) and a memory 704, which can communicate with each other via a bus or other data transfer system 706. The mobile computing and/or communication system 700 may further include various input/output (I/O) devices and/or interfaces 710, such as a touchscreen display, an audio jack, and optionally a network interface 712. In an example embodiment, the network interface 712 can include one or more radio transceivers configured for compatibility with any one or more standard wireless and/or cellular protocols or access technologies (e.g., 2nd (2G), 2.5, 3rd (3G), 4th (4G) generation, and future generation radio access for cellular systems, Global System for Mobile communication (GSM), General Packet Radio Services (GPRS), Enhanced Data GSM Environment (EDGE), Wideband Code Division Multiple Access (WCDMA), LTE, CDMA2000, WLAN, Wireless Router (WR) mesh, and the like). Network interface 712 may also be configured for use with various other wired and/or wireless communication protocols, including TCP/IP, UDP, SIP, SMS, RTP, WAP, CDMA, TDMA, UMTS, UWB, WiFi, WiMax, Bluetooth, IEEE 802.11x, and the like. In essence, network interface 712 may include or support virtually any wired and/or wireless communication mechanisms by which information may travel between the mobile computing and/or communication system 700 and another computing or communication system via network 714.

The memory 704 can represent a machine-readable medium on which is stored one or more sets of instructions, software, firmware, or other processing logic (e.g., logic 708) embodying any one or more of the methodologies or functions described and/or claimed herein. The logic 708, or a portion thereof, may also reside, completely or at least partially within the processor 702 during execution thereof by the mobile computing and/or communication system 700. As such, the memory 704 and the processor 702 may also constitute machine-readable media. The logic 708, or a portion thereof, may also be configured as processing logic or logic, at least a portion of which is partially implemented in hardware. The logic 708, or a portion thereof, may further be transmitted or received over a network 714 via the network interface 712. While the machine-readable medium of an example embodiment can be a single medium, the term "machine-readable medium" should be taken to include a single non-transitory medium or multiple non-transitory media (e.g., a centralized or distributed database, and/or associated caches and computing systems) that store the one or more sets of instructions. The term "machine-readable medium" can also be taken to include any non-transitory medium that is capable of storing, encoding or carrying a set of instructions for execution by the machine and that cause the machine to perform any one or more of the methodologies of the various embodiments, or that is capable of storing, encoding or carrying data structures utilized by or associated with such a set of instructions. The term "machine-readable medium" can accordingly be taken to include, but not be limited to, solid-state memories, optical media, and magnetic media.

With general reference to notations and nomenclature used herein, the description presented herein may be disclosed in terms of program procedures executed on a computer or a network of computers. These procedural descriptions and representations may be used by those of ordinary skill in the art to convey their work to others of ordinary skill in the art.

A procedure is generally conceived to be a self-consistent sequence of operations performed on electrical, magnetic, or optical signals capable of being stored, transferred, combined, compared, and otherwise manipulated. These signals may be referred to as bits, values, elements, symbols, characters, terms, numbers, or the like. It should be noted, however, that all of these and similar terms are to be associated with the appropriate physical quantities and are merely convenient labels applied to those quantities. Further, the manipulations performed are often referred to in terms such as adding or comparing, which operations may be executed by one or more machines. Useful machines for performing operations of various embodiments may include general-purpose digital computers or similar devices. Various embodiments also relate to apparatus or systems for performing these operations. This apparatus may be specially constructed for a purpose, or it may include a general-purpose computer as selectively activated or reconfigured by a computer program stored in the computer. The procedures presented herein are not inherently related to a particular computer or other apparatus. Various general-purpose machines may be used with programs written in accordance with teachings herein, or it may prove convenient to construct more specialized apparatus to perform methods described herein.

In various embodiments as described herein, example embodiments include at least the following examples.

An electronic device comprising: a processor with a plurality of selectable performance levels; a sensor; and an adaptive thermal and performance management subsystem in data communication with the processor and the sensor, the adaptive thermal and performance management subsystem to: receive sensor information from the sensor, the sensor information including information for determining if the electronic device is positioned proximately to an active airflow; determine a device context from the sensor information; and dynamically modify the performance level of the processor by implementing one of the plurality of selectable performance levels of the processor based on the device context.

The electronic device as claimed above wherein the adaptive thermal and performance management subsystem being further configured to select a policy from the group consisting of: an active cooling policy, a passive policy, an adaptive performance policy, and a critical policy.

The electronic device as claimed above wherein the sensor information including information for determining if the electronic device is inserted into a dock with an active airflow.

The electronic device as claimed above wherein the adaptive thermal and performance management subsystem to dynamically increase the performance level of the processor if the electronic device is positioned proximately to an active airflow.

The electronic device as claimed above wherein the adaptive thermal and performance management subsystem to dynamically decrease the performance level of the processor if the electronic device is not positioned proximately to an active airflow.

The electronic device as claimed above wherein the adaptive thermal and performance management subsystem to dynamically monitor the current temperature of the electronic device.

The electronic device as claimed above wherein the adaptive thermal and performance management subsystem to dynamically modify the performance level of the processor by changing a power level and changing a thermal envelope by modifying skin temperature ($T_{skin}$) limits.

The electronic device as claimed above wherein the sensor information includes orientation data associated with orientation of the electronic device, wherein the device context is further based on the orientation of the electronic device.

A method comprising: providing a processor with a plurality of selectable performance levels and a sensor in an electronic device; receiving sensor information from the sensor, the sensor information including information for determining if the electronic device is positioned proximately to an active airflow; determining a device context from the sensor information; and dynamically modifying the performance level of the processor by implementing one of a plurality of selectable performance levels of the processor based on the device context.

The method as claimed above including selecting a policy from the group consisting of: an active cooling policy, a passive policy, an adaptive performance policy, and a critical policy.

The method as claimed above wherein the sensor information including information for determining if the electronic device is inserted into a dock with an active airflow.

The method as claimed above including dynamically increasing the performance level of the processor if the electronic device is positioned proximately to an active airflow.

The method as claimed above including dynamically decreasing the performance level of the processor if the electronic device is not positioned proximately to an active airflow.

The method as claimed above including dynamically monitoring the current temperature of the electronic device.

The method as claimed above wherein dynamically modifying the performance level of the processor includes changing a power level and changing a thermal envelope by modifying skin temperature ($T_{skin}$) limits.

The method as claimed above wherein the sensor information includes orientation data associated with orientation of the electronic device, wherein the device context is further based on the orientation of the electronic device.

A non-transitory machine-useable storage medium embodying instructions which, when executed by a machine, cause the machine to: receive sensor information from a sensor, the sensor information including information for determining if an electronic device is positioned proximately to an active airflow; determine a device context from the sensor information; and dynamically modify the performance level of a processor having a plurality of selectable performance levels by implementing one of a plurality of selectable performance levels of the processor based on the device context.

The machine-useable storage medium as claimed above being further configured to select a policy from the group consisting of: an active cooling policy, a passive policy, an adaptive performance policy, and a critical policy.

The machine-useable storage medium as claimed above wherein the sensor information including information for determining if the electronic device is inserted into a dock with an active airflow.

The machine-useable storage medium as claimed above being further configured to dynamically increase the performance level of the processor if the electronic device is positioned proximately to an active airflow.

The machine-useable storage medium as claimed above being further configured to dynamically decrease the performance level of the processor if the electronic device is not positioned proximately to an active airflow.

The machine-useable storage medium as claimed above being further configured to dynamically monitor the current temperature of the electronic device.

The machine-useable storage medium as claimed above being further configured to dynamically modify the performance level of the processor by changing a power level and changing a thermal envelope by modifying skin temperature ($T_{skin}$) limits.

The machine-useable storage medium as claimed above wherein the sensor information includes orientation data associated with orientation of the electronic device, wherein the device context is further based on the orientation of the electronic device.

An electronic system comprising: an electronic device docking mechanism with an active airflow producing element; and an electronic device for insertion into the electronic device docking mechanism, the electronic device including: a processor with a plurality of selectable performance levels; a sensor; and an adaptive thermal and performance management subsystem in data communication with the processor and the sensor, the adaptive thermal and performance management subsystem to: receive sensor information from the sensor, the sensor information including information for determining if the electronic device is positioned in the electronic device docking mechanism; determine a device context from the sensor information; and dynamically modify the performance level of the processor by implementing one of the plurality of selectable performance levels of the processor based on the device context.

The electronic system as claimed above wherein the adaptive thermal and performance management subsystem being further configured to select a policy from the group consisting of: an active cooling policy, a passive policy, an adaptive performance policy, and a critical policy.

The electronic system as claimed above wherein the sensor information including information for determining if the electronic device is positioned proximately to an active airflow.

The electronic system as claimed above wherein the adaptive thermal and performance management subsystem to dynamically increase the performance level of the processor if the electronic device is positioned proximately to an active airflow.

The electronic system as claimed above wherein the adaptive thermal and performance management subsystem to dynamically decrease the performance level of the processor if the electronic device is not positioned proximately to an active airflow.

The electronic system as claimed above wherein the adaptive thermal and performance management subsystem to dynamically monitor the current temperature of the electronic device.

The electronic system as claimed above wherein the adaptive thermal and performance management subsystem to dynamically modify the performance level of the processor by changing a power level and changing a thermal envelope by modifying skin temperature ($T_{skin}$) limits.

The electronic system as claimed above wherein the sensor information includes orientation data associated with orientation of the electronic device, wherein the device context is further based on the orientation of the electronic device.

An apparatus comprising: a data processing means with a plurality of selectable performance levels; a sensing means; and an adaptive thermal and performance management means in data communication with the data processing means and the sensing means, the adaptive thermal and performance management means to: receive sensing information from the sensing means, the sensing information including information for determining if the apparatus is positioned proximately to an active airflow; determine a device context from the sensing information; and dynamically modify the performance level of the data processing means by implementing one of the plurality of selectable performance levels of the data processing means based on the device context.

The apparatus as claimed above wherein the adaptive thermal and performance management means being further configured to select a policy from the group consisting of: an active cooling policy, a passive policy, an adaptive performance policy, and a critical policy.

The apparatus as claimed above wherein the sensing information including information for determining if the apparatus is inserted into a dock with an active airflow.

The apparatus as claimed above wherein the adaptive thermal and performance management means to dynamically increase the performance level of the data processing means if the apparatus is positioned proximately to an active airflow.

The apparatus as claimed above wherein the adaptive thermal and performance management means to dynamically decrease the performance level of the data processing means if the apparatus is not positioned proximately to an active airflow.

The apparatus as claimed above wherein the adaptive thermal and performance management means to dynamically monitor the current temperature of the apparatus.

The apparatus as claimed above wherein the adaptive thermal and performance management means to dynamically modify the performance level of the data processing means by changing a power level and changing a thermal envelope by modifying skin temperature ($T_{skin}$) limits.

The apparatus as claimed above wherein the sensing information includes orientation data associated with orientation of the apparatus, wherein the device context is further based on the orientation of the apparatus.

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. An electronic device comprising:

a processor with a plurality of selectable performance levels;

a thermal sensor to measure a current temperature of the electronic device;

an airflow sensor to determine if the electronic device is positioned proximately to an active airflow and to determine a fan state corresponding to the active airflow; and an adaptive thermal and performance management subsystem in data communication with the processor, the thermal sensor, and the airflow sensor, the adaptive thermal and performance management subsystem to:

receive sensor information from the thermal sensor and the airflow sensor, the sensor information including information indicative of the current temperature of the electronic device, the fan state, and information for determining if the electronic device is positioned proximately to an active airflow;

determine a device context from the sensor information; and dynamically modify the performance level of the processor by implementing one of the plurality of selectable performance levels of the processor based on the device context.

2. The electronic device of claim 1 wherein the adaptive thermal and performance management subsystem being further configured to select a policy from the group consisting of: an active cooling policy, a passive policy, an adaptive performance policy, and a critical policy.

3. The electronic device of claim 1 wherein the sensor information including information for determining if the electronic device is inserted into a dock with an active airflow.

4. The electronic device of claim 1 wherein the adaptive thermal and performance management subsystem to dynamically increase the performance level of the processor if the electronic device is positioned proximately to an active airflow.

5. The electronic device of claim 1 wherein the adaptive thermal and performance management subsystem to dynamically decrease the performance level of the processor if the electronic device is not positioned proximately to an active airflow.

6. The electronic device of claim 1 wherein the adaptive thermal and performance management subsystem to dynamically modify the performance level of the processor by changing a power level and changing a thermal envelope by modifying skin temperature ($T_{skin}$) limits.

7. The electronic device of claim 1 wherein the sensor information includes orientation data associated with orientation of the electronic device, wherein the device context is further based on the orientation of the electronic device.

8. A method comprising:

providing a processor with a plurality of selectable performance levels, a thermal sensor, and an airflow sensor in an electronic device;

receiving sensor information from the thermal sensor and the airflow sensor, the sensor information including information indicative of the current temperature of the electronic device, a fan state corresponding to an active airflow, and information for determining if the electronic device is positioned proximately to the active airflow;

determining a device context from the sensor information; and dynamically modifying the performance level of the processor by implementing one of a plurality of selectable performance levels of the processor based on the device context.

9. The method of claim 8 including selecting a policy from the group consisting of: an active cooling policy, a passive policy, an adaptive performance policy, and a critical policy.

10. The method of claim 8 wherein the sensor information including information for determining if the electronic device is inserted into a dock with an active airflow.

11. The method of claim 8 including dynamically increasing the performance level of the processor if the electronic device is positioned proximately to an active airflow.

12. The method of claim 8 including dynamically decreasing the performance level of the processor if the electronic device is not positioned proximately to an active airflow.

13. The method of claim 8 wherein dynamically modifying the performance level of the processor includes changing a power level and changing a thermal envelope by modifying skin temperature ($T_{skin}$) limits.

14. The method of claim 8 wherein the sensor information includes orientation data associated with orientation of the electronic device, wherein the device context is further based on the orientation of the electronic device.

15. A non-transitory machine-useable storage medium embodying instructions which, when executed by a machine, cause the machine to:

receive sensor information from a thermal sensor and an airflow sensor, the sensor information including information indicative of a current temperature of an electronic device, a fan state corresponding to an active airflow, and information for determining if the electronic device is positioned proximately to the active airflow;

determine a device context from the sensor information; and dynamically modify the performance level of a processor having a plurality of selectable performance levels by implementing one of a plurality of selectable performance levels of the processor based on the device context.

16. The machine-useable storage medium of claim 15 being further configured to select a policy from the group consisting of: an active cooling policy, a passive policy, an adaptive performance policy, and a critical policy.

17. The machine-useable storage medium of claim 15 wherein the sensor information including information for determining if the electronic device is inserted into a dock with an active airflow.

18. The machine-useable storage medium of claim 15 being further configured to dynamically increase the performance level of the processor if the electronic device is positioned proximately to an active airflow.

* * * * *